United States Patent [19]

Tomljenovic

[11] Patent Number: 4,955,072
[45] Date of Patent: Sep. 4, 1990

[54] METHOD OF GENERATING AN AMPLITUDE-MODULATED ISB TRANSMISSION SIGNAL AND APPARATUS FOR CARRYING OUT THE METHOD

[75] Inventor: Nenad Tomljenovic, Nussbaumen, Switzerland

[73] Assignee: Asea Brown Boveri Ltd, Baden, Switzerland

[21] Appl. No.: 396,669

[22] Filed: Aug. 22, 1989

[30] Foreign Application Priority Data

Sep. 15, 1988 [CH] Switzerland ............... 3445/88-4

[51] Int. Cl.$^5$ .................................. H04B 1/68
[52] U.S. Cl. .................................. 455/108; 455/47;
455/104; 381/15; 381/16
[58] Field of Search ............... 455/47, 102, 103, 104,
455/108; 381/15, 16; 332/151, 170, 167, 149

[56] References Cited

U.S. PATENT DOCUMENTS

| | | | |
|---|---|---|---|
| 4,324,952 | 4/1982 | Smiley . | |
| 4,656,440 | 4/1987 | Gautschi | 455/47 |
| 4,725,788 | 2/1988 | Lodahl | 455/108 |
| 4,760,354 | 7/1988 | Kianush | 455/47 |

FOREIGN PATENT DOCUMENTS 0193655  9/1986  European Pat. Off. .

OTHER PUBLICATIONS

Electronic Communication Systems, McGraw-Hill 1977, pp. 142–144, G. Kennedy.
Brown Boveri Mitt. (Brown Boveri Review) 5 (1984), pp. 202–205.
The National Telesystems Conference, 7-10, Nov. 82, Galveston, Tex. IEEE (U.S.) S. Udalov: "Independent Sideband Modulation/Demodulation using Digitally Implemented Hilbert Transforms", pp. D3.5.2–D3.5.5.
The National Telesystems Conference, 7-10 Nov. 1982, Galveston, Tex., IEEE (U.S.), J.C. Springett: "Discrete-Time Signal-Processing Theory for Optimum SSB and ISB Modulation/Demodulation", pp. D3.4.1–D3.4.5.

Primary Examiner—Reinhard J. Eisenzopf
Assistant Examiner—Lisa D. Charouel
Attorney, Agent, or Firm—Oblon, Spivak, McClelland, Maier & Neustadt

[57] ABSTRACT

In the case of a method for the generation of an amplitude-modulated ISB transmission signal from different AF signal (NF1,2), the signal vectors are split into signal components (x1,y1 and x2, y2, respectively), components sums (X,Y) are formed from the signal components and an amplitude signal (A(t)) and a harmonic phase signal are derived from the component sums. Amplitude signal and phase signal are then further processed separately and combined at the single transmitting tube (43) by combined amplitude modulation and phase modulation into the final transmission signal.

12 Claims, 4 Drawing Sheets

METHOD OF GENERATING AN AMPLITUDE-MODULATED ISB TRANSMISSION SIGNAL AND APPARATUS FOR CARRYING OUT THE METHOD

BACKGROUND OF THE INVENTION

1. Field of the Invention

The present invention relates to the field of radio broadcasting transmission. It relates in particular to a method of generating an amplitude-modulated transmission signal with an upper side band and a lower side band, which side bands transmit independently of each other different information in the form of different AF signals. Such a method is known, for example, from the book by G. Kennedy, Electronic Communication Systems, McGraw-Hill 1977, pages 142-144.

The invention relates furthermore to an apparatus for carrying out the method.

2. Discussion of Background

In radio broadcasting transmission, which operates with amplitude modulation, both methods with which only one of the two side bands produced is transmitted (SSB = single side band) and methods with which a number of side bands are transmitted which contain, independently of each other, different information (ISB = independent side band) are known.

The ISB methods specifically make possible a simultaneous transmission of different information with the aid of only one carrier and thus contribute to an economical utilization of the frequency bands.

In the case of the ISB method known from the publication named at the beginning, for the generation of the transmission signal, the different (upper and lower) side bands are produced individually by corresponding modulation and filtration, subsequently added and converted to the final carrier frequency (see FIGS. 6-8).

The transmission signal produced in this way is finally amplified to the transmitted power with the aid of linear RF amplifiers and fed into an antenna.

What is disadvantageous about this method is that the linear RF power amplification in the transmitter output stage makes high requirements on the circuitry and, above all, leads to unfavorable efficiencies.

Similar problems also occur in the case of the SSB methods operating with linear amplification. Therefore, it has been proposed in this field (EP-A1-0,193,655), not to generate the SSB signal in the small signal range and subsequently amplify it linearly, but to form it directly at the single transmitting tube in the transmitter output stage by a combined amplitude and phase modulation.

For this purpose, an amplitude signal and a phase signal, which contain the amplitude and phase information of the SSB signal to be formed, are generated from the low-frequency input signal.

The amplitude signal can then be amplified efficiently by means of a switching amplifier and passed to the anode of the transmitting tube, while the phase signal is available, after a frequency conversion, at a control grid of the transmitting tube.

The amplitude signal is produced from the orthogonal components of the input signal, obtained by a Hilbert transformation, in a downstream amplitude computer.

The phase signal is produced, in the case of the known method, from these orthogonal components by a suitable cyclic scanning and subsequent processing in a quotient computer.

SUMMARY OF THE INVENTION

Accordingly, one object of this invention is to provide a novel ISB method which has the same advantages as the SSB method described above and to specify a corresponding apparatus for carrying out the method.

The object is achieved in the case of a method of the type named at the beginning wherein (a) the AF signals are split into their orthogonal signal components;

(b) from the in-phase signal components of the two AF signals and of a carrier amplitude, in each a component sum X and Y is formed, a signal component with inverse operational sign being added in one of the component sums;

(c) from the component sums, an amplitude signal A(t) is calculated according to the formula $$A(t) = \sqrt{(X^2 + Y^2)};$$

(d) the component sums are in each case inverted;

(e) the component sums and their inverses are cyclically scanned with a subcarrier frequency in the order $X, Y, -X, -Y$ or $X, -Y, -X, Y$;

(f) a phase signal is obtained from the scanning signal; and (g) the amplitude signal and the phase signal are in each case used for the anode modulation and grid modulation of a transmitting tube.

The method has the advantage that here the individual side bands do not have to be generated at small signal level and subsequently amplified linearly to high power, instead the transmitting signal is formed directly at the transmitting tube from an amplitude signal and a phase signal, it being possible for the amplitude signal to be amplified to the transmitted power level in a simple way by means of a switching amplifier.

The apparatus according to the invention comprises (a) first means for the splitting of the AF signals into their orthogonal signal components;

(b) two adders, which are connected via their inputs to the outputs of the first means in such a way that they in each case form the corresponding component sums from the in-phase signal components and a carrier amplitude;

(c) a first inverter, which is arranged ahead of an input of one of the adders and exchanges the operational sign of one of the signal components;

(d) an amplitude computer, the inputs of which are connected to the outputs of the adders and the output of which is in connection with an amplitude output;

(e) two further inverters, the inputs of which are in each case connected to the outputs of the adders and exchange the operational sign of the component sums;

(f) a cyclic scanner with four inputs, which are in each case in connection with the outputs of the adders and the outputs of the further inverters in such a way that, in the cyclic scanning, the component sums and their inverses are scanned in the order $X, Y, -X, -Y$ or $X, -Y, -X, Y$;

(g) second means for the generation of a phase signal, which are in connection on the input side with the output of the cyclic scanner and on the output side with a phase output;

(h) a transmitting tube with an anode and a control grid; and (i) third means for the conditioning of the amplitude signal and of the phase signal, which are arranged between the transmitting tube and the amplitude output and the phase output.

In a first preferred exemplary embodiment of the process according to the invention, the splitting of the AF signals into their orthogonal components is carried out by means of a Hilbert transformation.

In a second preferred exemplary embodiment, the amplitude signal is firstly amplified in a switching amplifier and the amplified amplitude signal is used for the anode modulation of the transmitting tube.

Further exemplary embodiments emerge from the sub-claims.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
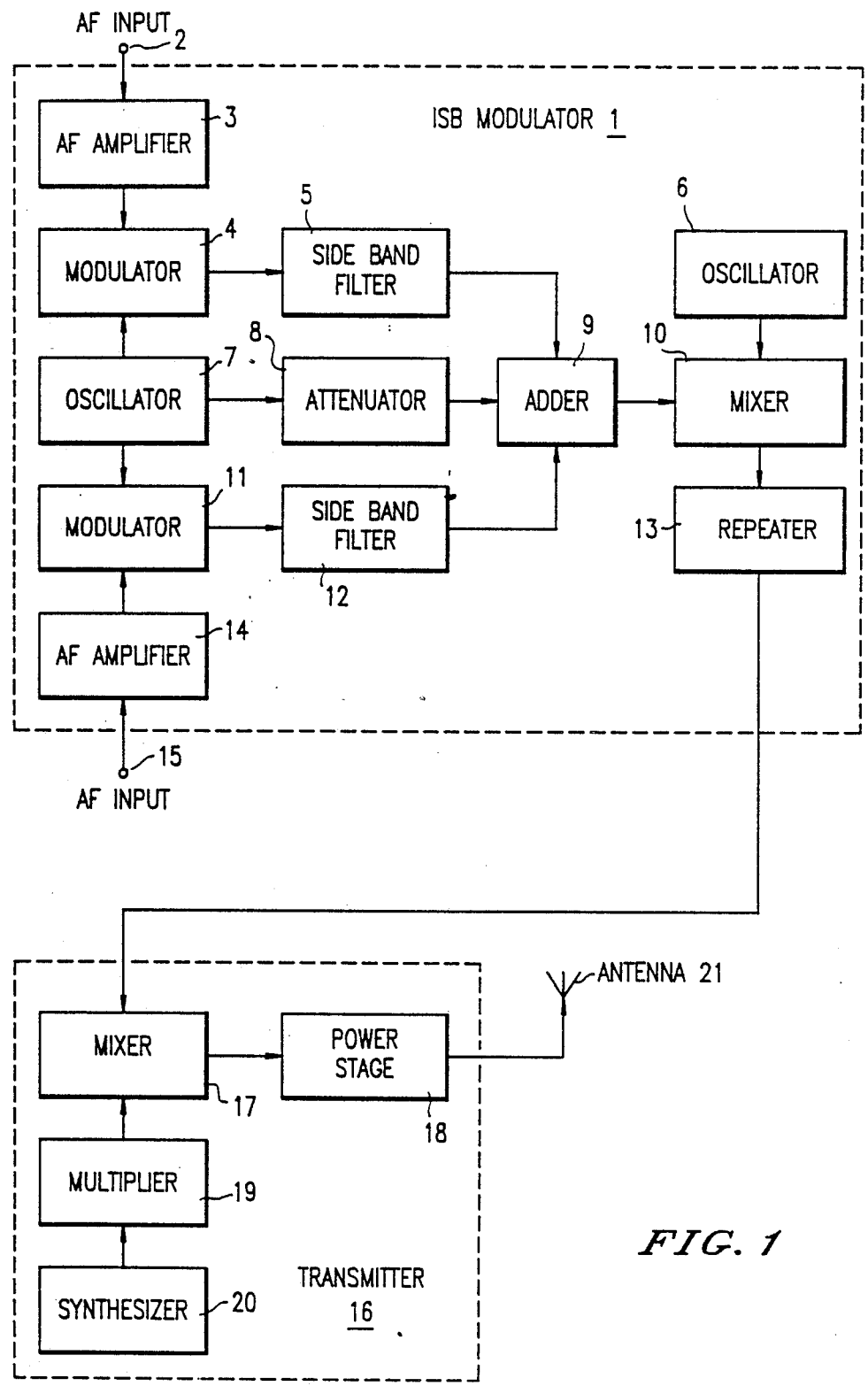
FIG. 1 shows in a block circuit diagram the layout of an ISB transmitter according to the prior art.

Referring now to the drawings, wherein like reference numerals designate identical or corresponding parts throughout the several views, in FIG. 1 an ISB transmitter according to the prior art is represented in a block circuit diagram. It is made up of an ISB modulator 1 and the actual transmitter 16.

The ISB modulator 1 has two AF inputs 2 and 15 at which the two independent AF signals to be transmitted are available. The AF signals pass from the AF inputs 2, 15 via corresponding AF amplifiers 3, 14 to modulators 4, 11, where they are modulated onto a first carrier originating from an oscillator 7.

The two double side band signals thereby produced are freed of the one side band which is undesired in that particular case in suitable side band filters 5, 12 and are subsequently fed to an adder 9, where they are added to the first carrier, reduced in an attenuator 8.

The resulting sum signal is converted in a mixer 10 to a frequency originating from a further oscillator 6, subsequently boosted in an intermediate repeater 13 and finally converted in a further mixer 17 into a frequency band which is determined by a synthesizer 20 with following multiplier 19.

The final amplification of the transmission signal is undertaken by a power stage 18, the output of which is in connection with an antenna 21.

The known ISB method is therefore distinguished by the following characteristic features:

the independent side bands are generated directly at small signal level and combined by addition into a transmission signal; and the power amplification in the transmitter output stage takes place by means of a linear RF amplifier, since the transmission signal must be amplified as a whole.

Figure 2A:
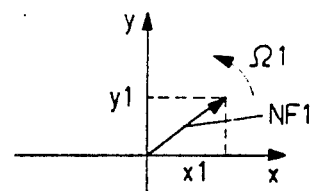
FIG. 2A,B show two independent AF signals in vector representation with their orthogonal signal components.
Figure 2B:
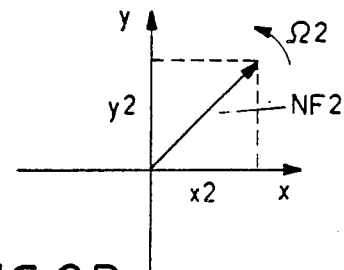

The present invention adopts here a completely different approach, which is to be explained with the aid of the vector representations of the signals involved in FIGS. 2A–4:

Starting point are two independent AF signals NF1,2, which can be represented in an x-y plane as rotating vectors with the respective signal components x1,y1 and x2,y2. The first AF signal NF1 has the angular frequency $\Omega 1$, the second correspondingly has the angular frequency $\Omega 2$ (FIGS. 2A,B)

Figure 3A:
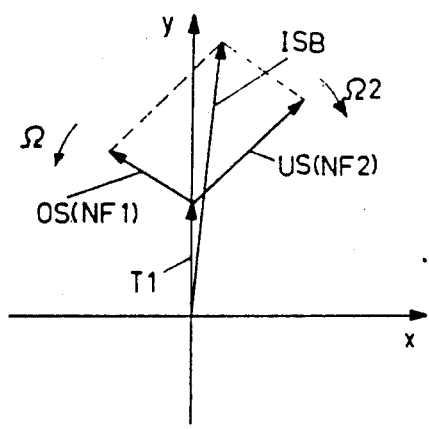
FIG. 3A shows the combination of the associated ISB signal with a first carrier in vector representation.

If the AF signals NF1 and NF2 are then added vectorially to a constant, non-rotating carrier T1, the rotation of the AF signals NF1,2 being chosen oppositely, the vector ISB shown in FIG. 3A is obtained, which although not yet rotating with a carrier frequency does contain the complete amplitude information of an ISB signal.

For the vectorial addition, the AF signals NF1,2 are firstly split into their orthogonal signal components x1,y1 and x2,y2, respectively, and the in-phase signal components x1,2 and y1,2 respectively, are added. The opposite rotation is achieved by the one signal component (x1 in FIG. 3A) in a component pair being added with negative operational sign. In this way, an upper side band OS is obtained from the one AF signal (NF1) and a lower side band US is obtained from the other AF signal (NF2).

In the case of FIG. 3A, for the sake of simplicity, a carrier amplitude T1 with negligible x component has been chosen. Equally well, however, a carrier amplitude T2 with negligible y component may also be taken (FIG. 3B) or a carrier amplitude with any x and y components.

In order then to obtain a complete transmission signal, the vector ISB must be additionally set in a constant rotation in the x-y plane with an angular frequency which corresponds to the carrier frequency. For this purpose the components of the vector ISB are cyclically scanned in a predetermined order.

Figure 3B:
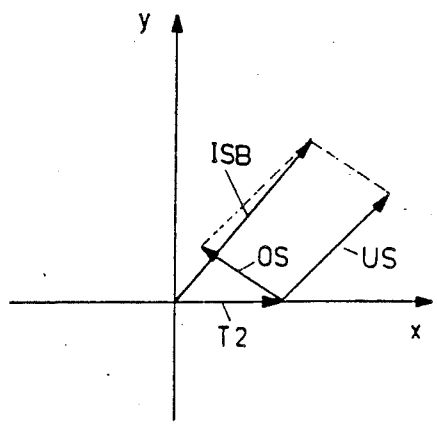
FIG 3B. shows the corresponding ISB signal with a second carrier.

The components of the vector ISB are component sums X and Y, which are obtained as follows with regard to FIGS. 3A and B:

$$X = x2 - x1 \qquad \text{FIG. 3A}$$
$$Y = y1 + y2 + T1$$

$$X = x2 - x1 + T2 \qquad \text{FIG. 3B}$$
$$Y = y1 + y2$$

Figure 4:
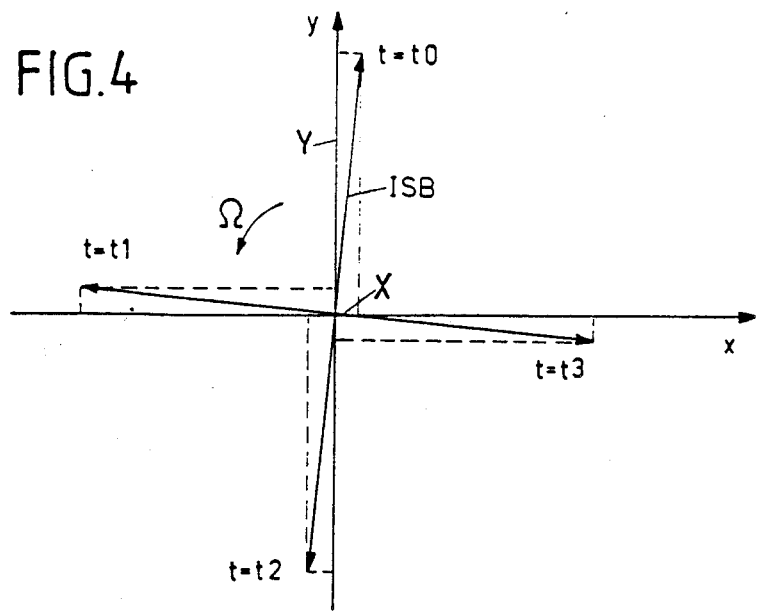
FIG. 4 shows the rotation of the ISB vector produced by cyclic scanning.

As clearly evident from FIG. 4, a rotation of vector ISB can be simulated by a suitable exchanging of the components X and Y with corresponding operational sign change.

If, for example, at the time t = t0, the vector assumes the same position in the plane as in FIG. 3A and at this time has the components X and Y, a counter-clockwise rotation through 90° produces at the later time t = t1 a vector with the components −Y,X. With a further rotation through 90° (t = t2), the vector has the components −X, −Y, with rotation once again through 90° (t = t3) the components Y,−X.

It follows from this that a vector ISB rotating with a subcarrier frequency 0 can be simulated by the components X and Y being scanned in the cyclic order X,−Y,−X,Y,X,−Y, . . . in a cyclic scanner rotating with Ω.

The order given applies here to a counter-clockwise rotation. For a clockwise rotation, the corresponding order is X,Y,−X,−Y,X,Y, . . .

Since the vector ISB is made up, inter alia, of the rotating and length-varying vectors of the AF signals NF1 and NF2, it itself changes direction and length, and consequently also phase, to a corresponding degree.

While the length can be calculated in a simple way from the component sums X and Y, and consequently an amplitude signal A(t) is available, the phase information contained in the ISB signal must be obtained in a special way.

The aim thereby is to obtain a harmonic phase signal of the form $\cos(\Omega^* t + \phi(t))$, which contains the phase information $\phi(t)$ necessary for the generation of the ISB signal.

If the subcarrier frequency 0 is much greater than the cut-off frequencies of the AF signals NF1 and NF2, the zero transitions of the abovementioned cos function are almost equal to the zero transitions of the sequences of scanning values which are produced with the cyclic scanning mentioned of the components X and Y.

Firstly, therefore, the zero transitions are determined. From these zero transitions, a square-wave signal is then generated, which is subsequently converted into the desired cos function by a band pass filtering.

The phase signal can then be converted from the subcarrier frequency Ω to the necessary carrier frequency Ω' and used for the phase modulation in the transmitter. The product $$A(t)^* \cos(\Omega^* t + \phi(t))$$

from the amplitude signal A(t) and the phase signal is finally the desired ISB signal.

This type of signal conditioning according to the invention has the following advantages:
  amplitude signal and phase signal are processed separately up to the transmitter output stage; and
  since the amplitude signal is a low-frequency signal with direct voltage component, a low-frequency switching amplifier, which achieves a particularly good efficiency, can be used for the necessary power amplification.

Figure 5:
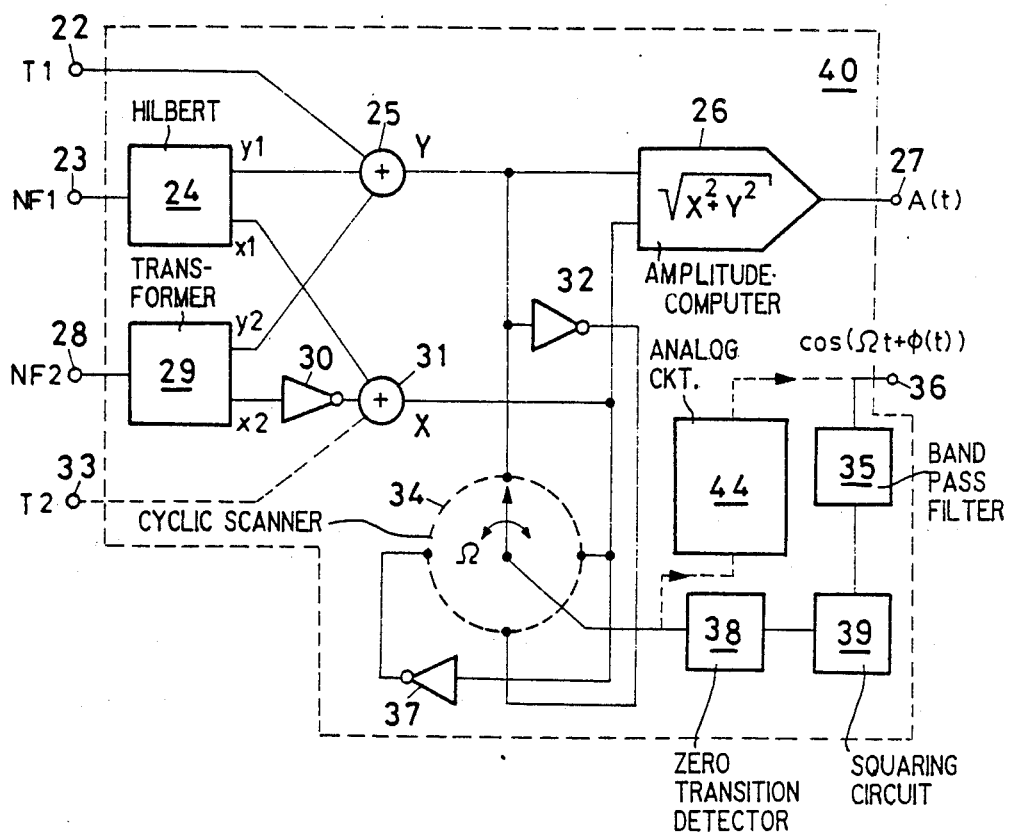
FIG. 5 shows the block circuit diagram of an ISB modulator according to a preferred exemplary embodiment of the invention, with two variants for the signal processing after the cyclic scanner 34.

A preferred embodiment of an ISB modulator according to the invention is reproduced in FIG. 5 in a block circuit diagram.

The ISB modulator 40 has two AF inputs 23, 28 and at least one carrier amplitude input 22 and 33, as well as two outputs, of which one is an amplitude output 27 and the other is a phase output 36.

The two independent AF signals NF1 and NF2 pass via the respective AF inputs 23, 28 to the inputs of two Hilbert transformers 24, 29 and are split there into their orthogonal signal components x1, y1 and x2, y2, respectively, which are available at corresponding outputs.

Downstream of the Hilbert transformers 24, 29 are adders 25, 31, in which the component sums X and Y are formed. In at least one of the adders, the carrier amplitude already mentioned is additionally added to the orthogonal signal components. If this carrier amplitude has only a y component (T1), the addition takes place in the adder 25 responsible for the component sum Y (represented by solid lines in FIG. 5). If, on the other hand, this carrier amplitude has only an x component (T2), it is added in the adder 31 responsible for the component sum X (represented by broken lines in FIG. 5). If, finally, both components exist, both adders 25 and 31 are used.

The operational sign change necessary for the separation into upper side band and lower side band (0S and US respectively) in the case of one of the signal components is effected by a first inverter 30, which is arranged between the adder 31 and the x2 output of the Hilbert transformer 29. It goes without saying that, with a possible operational sign change of different signal components, the inverter 30 must be arranged correspondingly differently.

For calculation of the amplitude or of the amplitude signal A(t), the component sums X and Y available at the outputs of the adders are passed into an amplitude computer 26, which in each case squares the component sums, adds the squares and takes the square root of the resulting sum, i.e.:

$$A(t) = \sqrt{(X^2 + Y^2)}$$

This amplitude signal A(t) from the amplitude computer 26 then appears at the amplitude output 27.

The component sums X and Y are, furthermore, passed directly and via two further inverters 32, 37 with changed operational sign to the four inputs of a cyclic scanner 34, the inputs being assigned counter-clockwise in the order X,Y,−X,−Y.

The cyclic scanner 34 scans the component sums according to the rotational direction in this or the reverse order with the subcarrier frequency Ω and (in a first variant of the circuit) passes the scanning values to a zero transition detector 38, which determines the zero transitions.

On the basis of these zero transitions, in a following squaring circuit 39, a square-wave function with identical zero transitions is then produced (the squaring circuit 39 may also be omitted if the zero transition detector 38 directly supplies a corresponding square-wave function at its output). From the square-wave function produced, the harmonic phase signal $$\cos(\Omega^* t + \phi(t))$$

is filtered out in a downstream bandpass filter 35 with the center frequency 2pi*Ω and passed on to the phase output 36.

Figure 7:
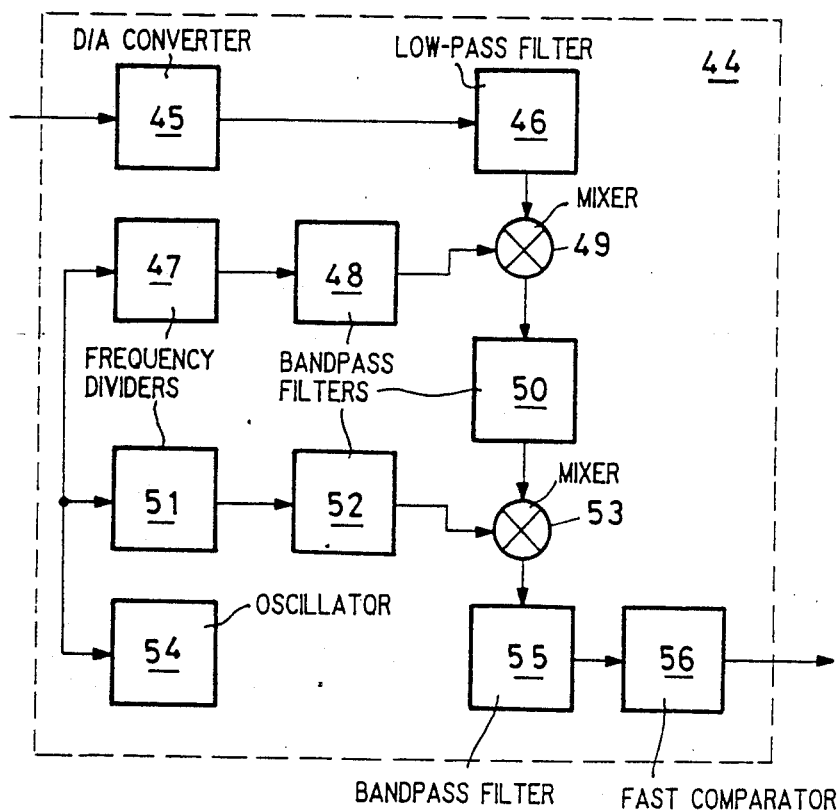
FIG. 7 shows the internal layout of an analog part 44 of the circuit according to FIG. 5.

In a second variant of the circuit, instead of zero transition detector 38, squaring circuit 39 and bandpass filter 35, an analog part 44 which is to be described in detail later in conjunction with FIG. 7, is arranged between the phase output 36 and the cyclic scanner 34.

The actual construction of Hilbert transformers 24, 29, cyclic scanner 34 and amplitude computer 26 is not to be dealt with in any more detail here, since possible exemplary embodiments of these function blocks are already known from EP-A1 0,193,655, mentioned at the beginning.

Figure 6:
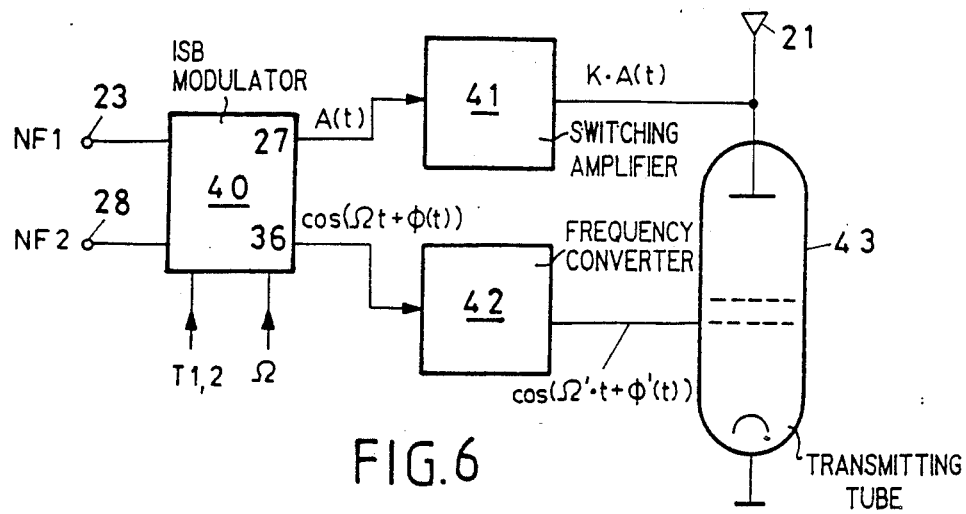
FIG. 6 shows the basic circuit diagram of a corresponding transmitter.

The signals generated in the ISB modulator 40, amplitude signal A(t) and phase signal cos (...), are finally further processed separately, according to FIG. 6, and combined in a transmitting tube 43 at high power level into the final ISB signal.

The further processing in this case comprises the power amplification of the amplitude signal A(t) in a switching amplifier 41, (by a gain k) and the conversion of the phase signal from the subcarrier frequency $\Omega$ to a final carrier frequency $\Omega'$ in a frequency converter 42. The original phase $\phi(t)$ is thereby converted into the final phase $\phi'(t)$.

The converted phase signal is fed to a control grid of the transmitting tube 43, the amplified amplitude signal K*A(c) passes to the anode of the transmitting tube.

As switching amplifier, preferably a so-called PSM (pulse stage modulator) amplifier is used, as is known from the publication Brown Boveri Mitt. (Brown Boveri Review) 5 (1984), pages 202–205.

As already mentioned before, in a variant of the circuit according to FIG. 5, an analog part 44, the internal layout of which is represented by way of example in FIG. 7, may be provided after the cyclic scanner 34 for signal processing.

In the case of this variant, the subcarrier frequency $\Omega$ is, for example, 25 kHz, the scanning in the cyclic scanner 34 takes place correspondingly with four times the frequency, i.e. with 100 kHz. In the analog part 44, the digital scanning signal from the cyclic scanner 34 is firstly fed to a D/A converter 45 and is converted there into an analog signal.

The analog signal is passed via a low-pass filter 46, which with an upper cut-off frequency of 37 kHz filters away the existing mirror spectra, to a first mixer 49 and is mixed there with a frequency of 50 kHz to 75 kHz.

After the filtering in a 75 kHz bandpass filter 50, the analog signal is mixed in a second mixer 53 with 125 kHz to 200 kHz. After a further filtering in a 200 kHz bandpass filter 55, the analog signal is finally fed to a fast comparator 56, which clips the signal and in this way reduces it to its phase information. Then, as phase signal, the clipped signal can be further processed directly (like the cos function in the other variant) in the transmitter.

The mixing frequencies of 50 kHz and 125 kHz are generated from a common 1 mHz oscillator 54 by corresponding division in the frequency dividers 47 (division by 20) and 51 (division by 8) with following filtering in the bandpass filters 48 and 52. The circuit blocks 47 to 55 altogether form an up-converter.

The variant just described, in which the phase information is extracted by the clipping only after the up-conversion, has the particular advantage that the influence of the limited bandwidth in the signal processing paths on the phase information is particularly small.

Altogether, the invention produces an ISB transmitter which can be constructed very simply and is distinguished by a high efficiency.

Obviously, numerous modifications and variations of the present invention are possible in light of the above teachings. It is therefore to be understood that, within the scope of the appended claims, the invention may be practiced otherwise than as specifically described herein.

What is claimed as new and desired to be secured by letters patent of the United States is:

1. A method of generating an amplitude-modulated ISB transmission signal with an upper side band and a lower side band, said side bands transmitting independently of each other different information in the form of two different AF signals, comprising the steps:
   (a) splitting each of the AF signals into a first and second signal component, said first and second signal components being orthogonal to each other for each AF signal;
   (b) forming from the first signal components and the second signal components of the two AF signals, component sums X and Y, wherein in one of the component sums one of the respective signal components is added with inverse operational sign, and wherein in at least one of the component sums a carrier amplitude is added;
   (c) calculating from the component sums an amplitude signal A(t) according to the formula $$A(t) = \sqrt{(X^2 + Y^2)};$$

(d) inverting the component sums;
   (e) cyclically scanning the component sums and an inverse of each component sum with a subcarrier frequency in one of two orders, $X, Y, -X, -Y$ and $X, -Y, -X, Y$, thereby producing a scanning signal;
   (f) obtaining a phase signal from the scanning signal; and
   (g) using the amplitude signal in each case for an anode modulation and a grid modulation of a transmitting tube.

2. The method as claimed in claim 1, further comprising:
   (a) using as the scanning signal an AC signal with zero transitions;
   (b) detecting the zero transitions of the scanning signal; and
   (c) generating a square-wave signal from the zero transitions of the scanning signal and subsequently subjecting the square-wave signal to a bandpass filtering, thereby producing a harmonic phase signal with a subcarrier frequency and a first phase, said harmonic phase signal having the same zero transitions as the scanning signal.

3. The method as claimed in claim 1, wherein the step of obtaining the phase signal comprises:
   converting the scanning signal into an analog signal;
   converting up the analog signal to a higher frequency; and
   clipping the upconverted analog signal.

4. The method as claimed in claim 2, wherein
   (a) the AF signals have an upper cut-off frequency; and
   (b) a subcarrier frequency is used which is substantially greater than said upper cut-off frequency.

5. The method as claimed in claim 1, wherein the splitting of the AF signals into their orthogonal signal components (x1, y1 and x2, y2, respectively) is carried out by means of a Hilbert transformation.

6. The method as claimed in claim 1, wherein the phase signal is first converted to a carrier frequency ($\Omega'$) which is higher than the subcarrier frequency ($\Omega$) and the converted phase signal is used for the grid modulation of the transmitting tube (43).

7. The method as claimed in claim 1 wherein the amplitude signal (A(t)) is first amplified in a switching amplifier (41) and the amplified amplitude signal is used for an anode modulation of the transmitting tube (43).

8. An apparatus for generating an amplitude-modulated ISB transmission signal with an upper side band and a lower side band, said side bands transmitting independently of each other different information in the form of two AF signals, comprising:
- (a) first means with a first and second output for splitting of a first AF signal into first and second signal components;
- (b) second means with a first and a second output for splitting of a second AF signal into first and second signal components;
- (c) a first and a second adder, one of said adders having at least three inputs, whereby the first outputs of the first and second means are connected to inputs of one of the two adders, and the second outputs of the first and second means are connected to inputs of the other of the two adders, and a carrier amplitude is applied to the third input of said one adder having at least three inputs, said first and second adders forming two component sums X and Y;
- (d) a first inverter which is arranged between one output of one of the first and second means and the respective input of one of the two adders, and which changes the operational sign of one of the first and second signal components;
- (e) an amplitude computer for computing an amplitude signal, with two inputs and one output, the inputs of which being connected to the outputs of the two adders, and the output of which being connected to an amplitude output;
- (f) two further inverters, the inputs of which are in each case connected to the outputs of the two adders, said further inverters changing the operational signs of the component sums;
- (g) a cyclic scanner for obtaining a scanning signal, with four inputs and one output, the four inputs being in each case in connection with the outputs of the two adders and the outputs of the further inverters in such a way that, in the cyclic scanning, the component sums and their inverses are scanned in one of two orders, $X,Y,-X,-Y$ and $X,-Y-X,Y$;
- (h) third means for obtaining a phase signal from said scanning signal, with an input and an output, said input being connected to the output of said cyclic scanner, and said output being connected to a phase output;
- (i) a transmitting tube with an anode and a control grid;
- (j) fourth means for amplifying the amplitude signal, said fourth means being arranged between the amplitude output and the anode of the transmitting tube; and
- (k) fifth means for conditioning the phase signal, said fifth means being arranged between the phase output and the control grid of the transmitting tube.

9. The apparatus as claimed in claim 8, wherein the first and second means each comprise a Hilbert transformer.

10. The apparatus as claimed in claim 9, wherein the third means comprises a zero transition detector followed by a bandpass filter.

11. The apparatus as claimed in claim 9, wherein the third means comprises an analog part with a D/A converter followed by an up-converter and a comparator.

12. The apparatus as claimed in claim 9, wherein the fourth means comprises a switching amplifier, and wherein the fifth means comprises a frequency converter.

* * * * *